(12) United States Patent
Jin

(10) Patent No.: US 9,875,976 B2
(45) Date of Patent: Jan. 23, 2018

(54) SWITCHING DEVICE

(71) Applicant: TAIWAN SEMICONDUCTOR MANUFACTURING COMPANY LTD., Hsinchu (TW)

(72) Inventor: Jun-De Jin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/985,393

(22) Filed: Dec. 31, 2015

(65) Prior Publication Data

US 2017/0194269 A1    Jul. 6, 2017

(51) Int. Cl.
*H01L 23/66* (2006.01)
*H01L 29/66* (2006.01)

(52) U.S. Cl.
CPC ........ *H01L 23/66* (2013.01); *H01L 29/66977* (2013.01); *H01L 2223/6677* (2013.01); *H01L 2223/6688* (2013.01)

(58) Field of Classification Search
CPC .......................... H01L 23/66; H01L 29/66977
See application file for complete search history.

(56) References Cited

U.S. PATENT DOCUMENTS

| | | | | |
|---|---|---|---|---|
| 5,422,505 A * | 6/1995 | Shirai | ............... | H01L 21/28211 257/327 |
| 5,608,231 A * | 3/1997 | Ugajin | ................... | B82Y 10/00 257/192 |
| 5,914,504 A * | 6/1999 | Augusto | ......... | H01L 21/823885 257/192 |
| 6,147,383 A * | 11/2000 | Kuroda | ............... | H01L 29/1083 257/344 |
| 6,184,553 B1 * | 2/2001 | Odanaka | ........... | H01L 21/28273 257/317 |
| 6,208,557 B1 * | 3/2001 | Bergemont | ........ | G11C 16/0408 257/319 |
| 6,798,012 B1 * | 9/2004 | Ma | ...................... | H01L 29/7887 257/314 |
| 7,723,774 B2 * | 5/2010 | Chen | .................. | G11C 16/0458 257/315 |
| 7,795,691 B2 * | 9/2010 | Zhang | ................. | H01L 29/1095 257/330 |
| 8,030,153 B2 * | 10/2011 | Wang | .................. | H01L 29/0878 257/329 |

(Continued)

FOREIGN PATENT DOCUMENTS

JP    2001068674 A  *  3/2001
JP    2006196789 A  *  7/2006

(Continued)

*Primary Examiner* — Ida M Soward
(74) *Attorney, Agent, or Firm* — WPAT, P.C., Intellectual Property Attorneys; Anthony King

(57) ABSTRACT

A semiconductor device includes a first doping region, a second doping region, and a channel region. The first doping region is doped with a first type of dopant. The second doping region is doped with the first type of dopant. The channel region is doped with a second type of dopant, wherein the channel region is configured to have a first region with a first concentration of the second type of dopant and a second region with a second concentration of the second type of dopant, and the second concentration is higher than the first concentration.

16 Claims, 10 Drawing Sheets

(56) References Cited

U.S. PATENT DOCUMENTS

| | | | | |
|---|---|---|---|---|
| 8,169,039 B2* | 5/2012 | Negoro | | H01L 29/42384 257/205 |
| 8,188,514 B2* | 5/2012 | Sugimoto | | H01L 29/0642 257/12 |
| 8,716,769 B2* | 5/2014 | Ihara | | H01L 27/1461 257/291 |
| 9,012,276 B2* | 4/2015 | Kapoor | | H01L 29/78654 438/198 |
| 9,490,027 B2* | 11/2016 | Song | | G11C 17/16 |
| 2002/0001868 A1* | 1/2002 | Joo | | G02F 1/1368 438/30 |
| 2003/0161192 A1* | 8/2003 | Kobayashi | | G11C 16/0475 365/200 |
| 2004/0048425 A1* | 3/2004 | Assaderaghi | | H01L 27/1203 438/154 |
| 2005/0179108 A1* | 8/2005 | Hossain | | H01L 29/7835 257/492 |
| 2005/0194621 A1* | 9/2005 | Howard | | H01L 29/8083 257/287 |
| 2006/0128105 A1* | 6/2006 | Ouyang | | H01L 21/823807 438/300 |
| 2009/0065865 A1* | 3/2009 | Ju | | H01L 21/26513 257/344 |
| 2010/0182853 A1* | 7/2010 | Ohsawa | | G11C 7/02 365/189.011 |
| 2015/0116029 A1* | 4/2015 | Litty | | H01L 29/1079 327/534 |
| 2016/0049391 A1* | 2/2016 | Colinge | | H01L 23/60 257/328 |

FOREIGN PATENT DOCUMENTS

| | | | | |
|---|---|---|---|---|
| KR | 20080008851 A | * | 1/2008 | |
| KR | 2008047152 A | * | 5/2008 | |
| WO | WO 2004049453 A1 | * | 6/2004 | H01L 29/105 |

* cited by examiner

SWITCHING DEVICE

BACKGROUND

An antenna switch is a device to route radio frequency (RF) signal from one input to multiple output paths. The RF signal can be a signal having a relatively large swing. The antenna switch is a first transistor stage of a cellular RF front-end module. For an antenna switch for the third generation (3G) or fourth generation (4G) application, the requirement for harmonic rejection is relatively strict. For example, when an input RF power of the RF signal is 33 dBm, the second harmonics caused by the antenna switch should be lower than −70 dBm.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
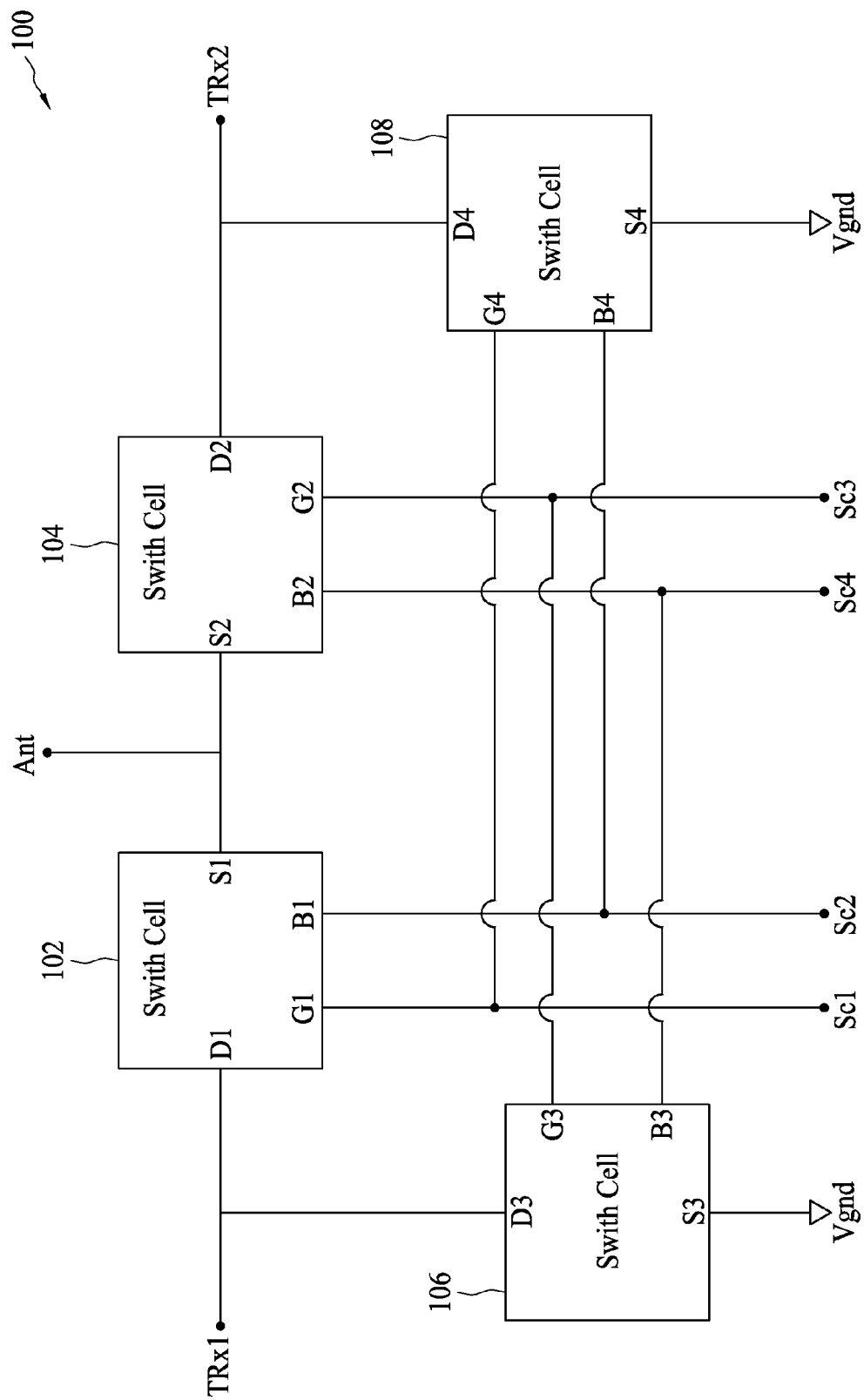
FIG. 1 is a diagram illustrating a switching device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

FIG. 1 is a diagram illustrating a switching device 100 in accordance with some embodiments. The switching device 100 may be an antenna switch for routing a radio frequency (RF) signal from one input to multiple output paths. For illustrative purpose, the switching device 100 is a single pole double throw (SPDT) switch. However, this is not a limitation of the embodiments. Referring to FIG. 1, the switching device 100 comprises a first switch cell 102, a second switch cell 104, a third switch cell 106, and a fourth switch cell 108. Each switch cell has four connecting terminals, i.e., a drain terminal, a source terminal, a gate terminal, and a body terminal. It is noted that the drain terminal and the source terminal are exchangeable depending on a voltage applied thereto.

In particular, for the first switch cell 102, the drain terminal D1 is coupled to a first port TRx1, the source terminal S1 is coupled to an antenna Ant, the gate terminal G1 is coupled to a first control signal Sc1, and the body terminal B1 is coupled to a second control signal Sc2. For the second switch cell 104, the drain terminal D2 is coupled to a second port TRx2, the source terminal S2 is coupled to the antenna Ant, the gate terminal G2 is coupled to a third control signal Sc3, and the body terminal B2 is coupled to a fourth control signal Sc4. For the third switch cell 106, the drain terminal D3 is coupled to the first port TRx1, the source terminal S3 is coupled to a reference voltage, e.g., the ground voltage Vgnd, the gate terminal G3 is coupled to the third control signal Sc3, and the body terminal B3 is coupled to the fourth control signal Sc4. For the fourth switch cell 108, the drain terminal D4 is coupled to the second port TRx2, the source terminal S4 is coupled to the ground voltage Vgnd, the gate terminal G4 is coupled to the first control signal Sc1, and the body terminal B4 is coupled to the second control signal Sc2.

According to some embodiments, the first control signal Sc1 and the third control signal Sc3 are complementary while the second control signal Sc2 and the fourth control signal Sc4 are complementary. In other words, when the first switch cell 102 and the fourth switch cell 108 are turned on by the first control signal Sc1, the second switch cell 104 and the third switch cell 106 are turned off by the third control signal Sc3.

According to some embodiments, the first switch cell 102, the second switch cell 104, the third switch cell 106, and the fourth switch cell 108 are configured to have the same configuration. This means that each of the switch cells 102, 104, 106, 108 has the same number of transistors and the same connectivity of the transistors. However, this is not a limitation of the embodiments.

Figure 2:
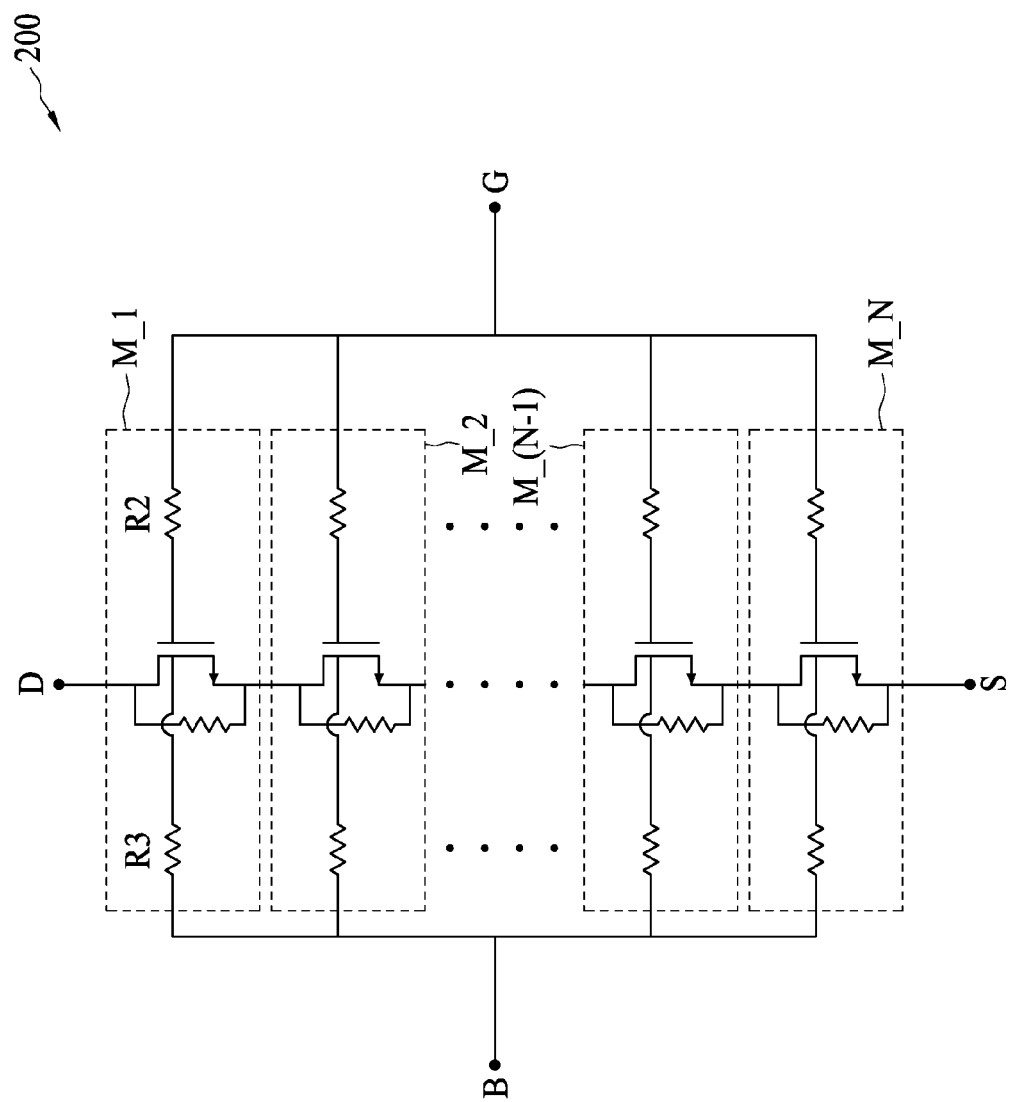
FIG. 2 is a diagram illustrating a switch cell in accordance with some embodiments.

FIG. 2 is a diagram illustrating a switch cell 200 in accordance with some embodiments. Referring to FIG. 2, the switch cell 200 has four terminals D, S, G, and B. The switch cell 200 comprises at least one transistor. According to some embodiments, the switch cell 200 comprises a plurality of transistors M_1~M_N. Moreover, the transistors M_1~M_N are connected in cascode. The drain terminal of the first transistor M_1 is connected to the terminal D. The source terminal of the last transistor M_N is connected to the terminal S. The gate terminals of the transistors M_1~M_N are connected to the terminal G. The bodies of the transistors M_1~M_N are connected to the terminal B. Each of the transistors M_1~M_N may be a metal-oxide-semiconductor field-effect transistor (MOSFET). In FIG. 2, each of the transistors M_1~M_N is modeled by three resistors R1, R2, R3. The resistor R1 represents the turn-on resistance between a drain terminal and a source terminal of a transistor. The resistor R2 represents the input resistance of a gate terminal of the transistor. The resistor R3 represents the body resistance of the transistor.

Figure 3:
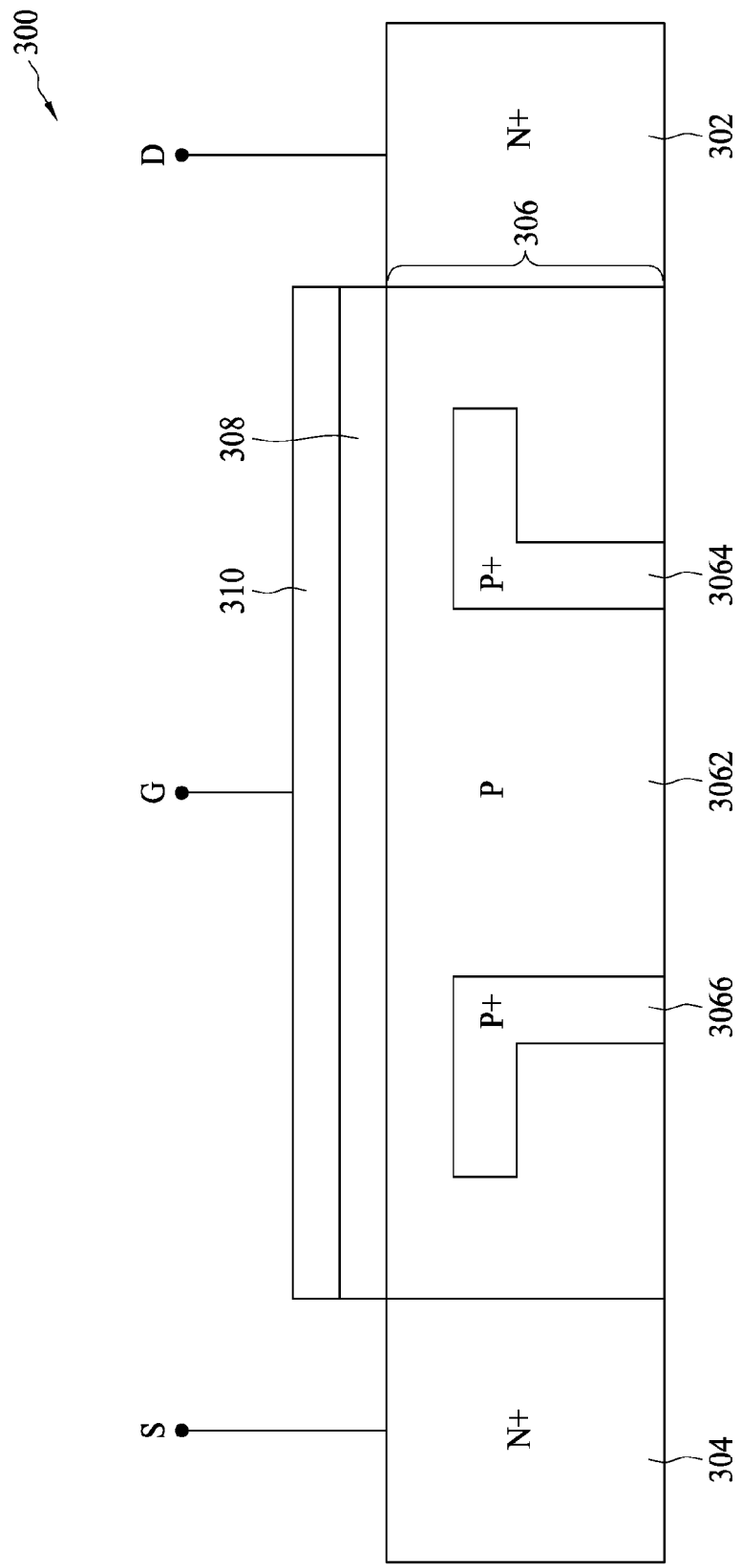
FIG. 3 is a diagram illustrating a cross-sectional view of a transistor in accordance with some embodiments.

In more particular, the semiconductor structure of each of the transistors M_1~M_N is shown in FIG. 3. FIG. 3 is a diagram illustrating a cross-sectional view of a transistor 300 in accordance with some embodiments. The transistor 300 comprises a first doping region 302, a second doping region 304, a channel region 306, a dielectric layer 308, and a gate layer 310. The channel region 306 is disposed between the first doping region 302 and the second doping region 304. The dielectric layer 308 is disposed over the channel region 306. The dielectric layer 308 may be an oxide layer. The gate layer 310 is disposed over the dielectric layer 308. The material of the gate layer 310 may be a combination of one or more metals and/or semiconductor materials. For example, the material of the gate layer 310 may be polysilicon, metal, etc. The first doping region 302 is doped with a first type of dopant. The second doping region 304 is doped with the first type of dopant. The channel region is doped with a second type of dopant. The second type of dopant is different from the first type of dopant. For illustrative purpose, the transistor 300 is an N-type MOSFET. Accordingly, the first type of dopant is N-type dopant while the second type of dopant is P-type dopant. The first doping region 302 and the second doping region 304 are the drain/source region of the transistor 300. For brevity, the first doping region 302 is the drain region D, the second doping region 304 is the source region S, and the gate layer 310 is the gate terminal G of the transistor 300. According to some embodiments, the first doping region 302, the second doping region 304, and the channel region 306 are disposed over a buried oxide (BOX) layer (not shown), which in turn is disposed over a silicon substrate layer (not shown).

According to some embodiments, the channel region 306 comprises a first region 3062, a second region 3064, and a third region 3066. The first region 3062 is lightly doped with the P-type dopant while the second region 3064 and the third region 3066 are heavily doped with the P-type dopant. Accordingly, the first region 3062, the second region 3064, and the third region 3066 are configured to have a first concentration, a second concentration, and a third concentration of the P-type dopant, respectively. Moreover, the second concentration and the third concentration are higher than the first concentration. According to some embodiments, the second concentration is substantially equal to the third concentration.

The second region 3064 and the third region 3066 are disposed within the first region 3062. According to some embodiments, the second region 3064 is near, but not overlapped with, the first doping region 302. The third region 3066 is near, but not overlapped with, the second doping region 304. In particular, the second region 3064 is closer to the first doping region 302 than the second doping region 304, and the third region 3066 is closer to the second doping region 304 than the first doping region 302. In addition, the second region 3064 and the third region 3066 do not overlap the dielectric layer 308. In other words, the second region 3064 is not touched with the first doping region 302, the third region 3066 is not touched with the second doping region 304, and the second region 3064 and the third region 3066 do not touch the dielectric layer 308. According to some embodiments, the second region 3064 and the third region 3066 are configured to extend in an "L" shape as shown in FIG. 3. However, this is not a limitation of the embodiments. The second region 3064 and the third region 3066 may be any shape as long as the above conditions are satisfied. For example, the second region 3064 and the third region 3066 may be spherical. Moreover, the second region 3064 and the third region 3066 may be configured to have different shapes. According to some embodiments, the distance between the second region 3064 and the first doping region 302 is substantially equal to the distance between the third region 3066 and the second doping region 304.

Moreover, according to the configuration of FIG. 3, when the second region 3064 is near, but not overlapped with, the first doping region 302, then the second region 3064, the first region 3062, and the first doping region 302 form a first PIN (p-intrinsic-n) diode. Similarly, when the third region 3066 is near, but not overlapped with, the second doping region 304, then the third region 3066, the first region 3062, and the second doping region 304 form a second PIN diode. It is noted that a PIN diode is a diode having an intrinsic semiconductor region between a P-type semiconductor region and an N-type semiconductor region. The p-type and n-type semiconductor regions are typically heavily doped. The intrinsic semiconductor region may be an undoped intrinsic semiconductor region or a lightly doped intrinsic semiconductor region. According to the embodiments, the first region 3062 is the intrinsic semiconductor region of the first and second PIN diodes.

Referring back to the switching device 100 of FIG. 1, when the transistors in the first switch cell 102, the second switch cell 104, the third switch cell 106, and the fourth switch cell 108 are configured to have the similar doping configuration as the transistor 300 in FIG. 3, the linearity performance of the switching device 100 is improved. In particular, when the switching device 100 is used to route the radio frequency (RF) signal between the first port TRx1 and the antenna Ant, or between the first port TRx1 and the antenna Ant, the power of harmonic of the switching device 100 is decreased. A harmonic of a wave is a component frequency of a signal that is an integer multiple of the fundamental frequency. For example, if the fundamental frequency is f, the harmonics have frequencies $2f$, $3f$, $4f$, . . . etc. The reason is explained in the following paragraphs.

Figure 4:
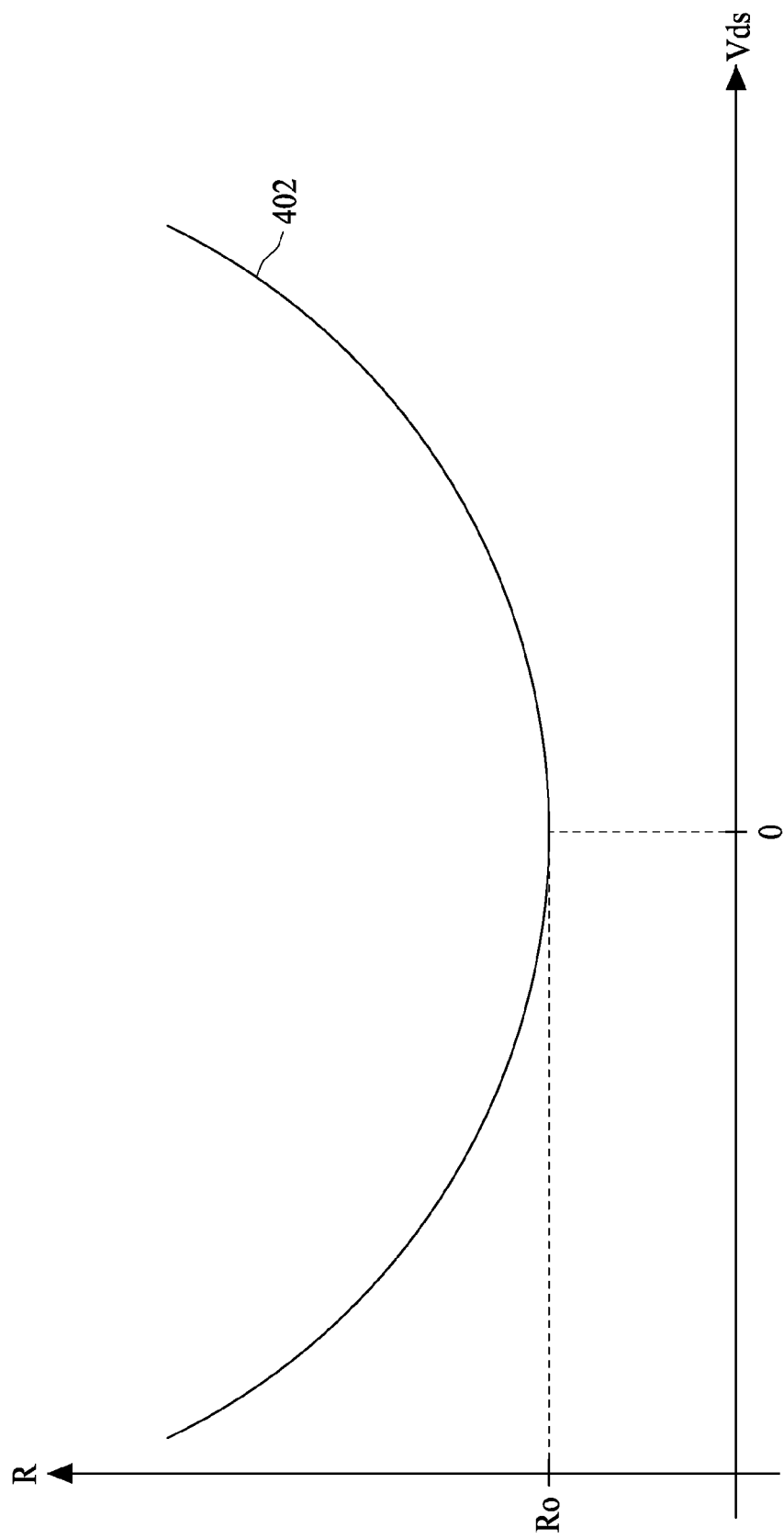
FIG. 4 is a diagram illustrating the variation of a resistance corresponding to a voltage between a drain terminal and a source terminal of a turned-on switch cell in accordance with some embodiments.

According to some embodiments, when a switch cell in the switching device 100 is turned on by the corresponding control signals, i.e., the gate control signal and the body control signal, the switch cell can be modeled by a resistor with a resistance R. When the switch cell is turned off by the corresponding control signals, the switch cell can be modeled by a capacitor with a capacitance C. For the resistance R of a turned-on switch cell, the variation of the resistance R corresponding to the voltage $V_{ds}$ between the drain terminal D and the source terminal S of the switch cell is shown in FIG. 4. Referring to FIG. 4, curve 402 represents the variation of the resistance R corresponding to the voltage $V_{ds}$. The curve 402 is a nonlinear curve. According to some embodiments, the curve 402 may be represented by the following non-linear quadratic equation (1):

$$R=R_0(1+V_{C1}V_{ds}+V_{C2}V_{ds}^2) \qquad (1)$$

$V_{ds}$ is the voltage between the drain terminal D and the source terminal S of the turned-on switch cell. $V_{C1}$ and $V_{C2}$ are non-linear coefficients of the terms $V_{ds}$ and $V_{ds}^2$, respectively. $R_0$ is a constant. It can be seen that the resistance R of the turned-on switch cell is $R_0$ when the voltage $V_{ds}$ is zero.

Similarly, for the capacitance C of a turned-off switch cell, the variation of the capacitance C corresponding to the voltage $V_{ds}$ between the drain terminal D and the source terminal S of the switch cell is also similar to the nonlinear curve of 402.

Figure 8:
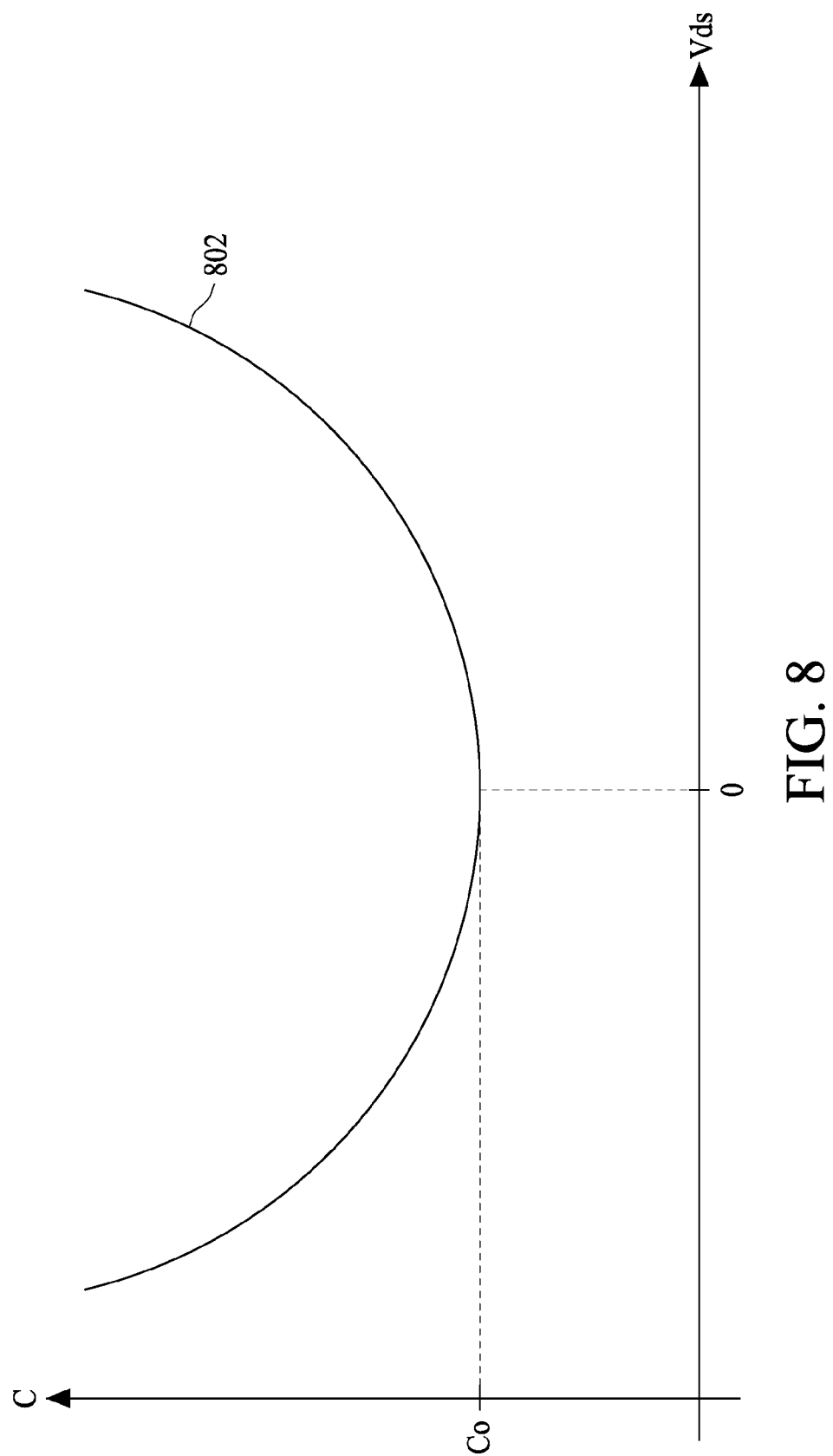
FIG. 8 is a diagram illustrating the variation of a capacitance corresponding to a voltage between a drain terminal and a source terminal of a turned-off switch cell in accordance with some embodiments.

The capacitance C will be discussed in FIG. 8. According to some embodiments, the capacitance C can be represented by the following non-linear quadratic equation (2):

$$C=C_0(1+V_{C1}V_{ds}+V_{C2}V_{ds}^2) \qquad (2)$$

As previously discussed, $V_{ds}$ is the voltage between the drain terminal D and the source terminal S of the turned-off switch cell. $V_{C1}$ and $V_{C2}$ are non-linear coefficients of the terms $V_{ds}$ and $V_{ds}^2$, respectively. In addition, $C_0$ is a constant. It can be seen that the capacitance C of the turned-off switch cell is $C_0$ when the voltage $V_{ds}$ is zero.

When the constants $R_0$, $C_0$, and the coefficients $V_{C1}$, $V_{C2}$ of equations (1) and (2) are obtained, the models of the turn-on switch cell and the turn-off switch cell (i.e., the resistance R and the capacitance C) are also obtained. Then, the models of the turn-on switch cell and the turn-off switch cell may replace the switch cells in the switching device 100 to analyze the frequency response of the switching device 100.

Figure 5:
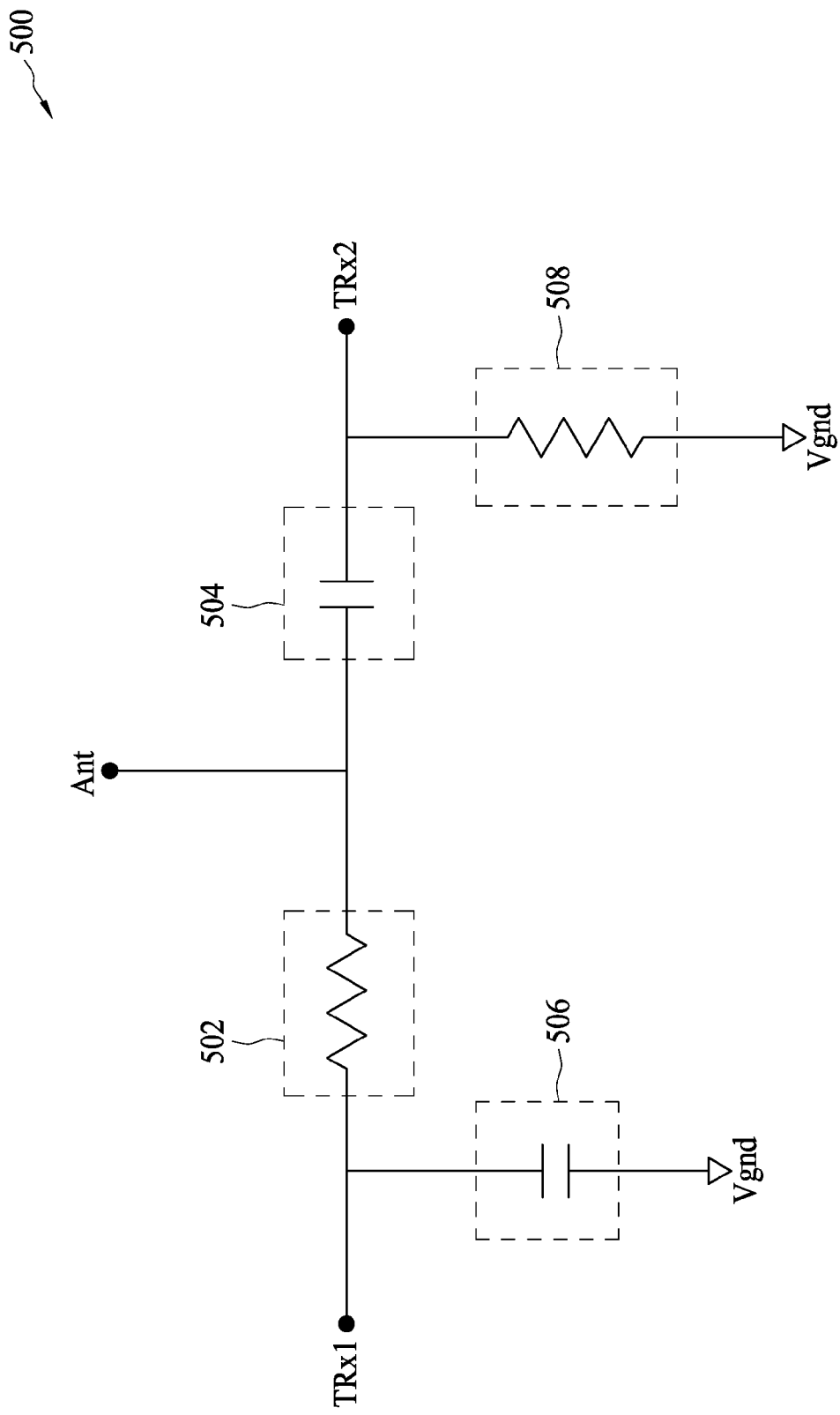
FIG. 5 is a diagram illustrating an equivalent circuit of a switching device in accordance with some embodiments.

For example, when the first switch cell 102 and the fourth switch cell 108 are turned on and the second switch cell 104 and the third switch cell 106 are turned off to route the RF signal between the first port TRx1 and the antenna Ant, the switching device 100 can be modeled by the circuit in FIG. 5. FIG. 5 is a diagram illustrating an equivalent circuit 500 of the switching device 100 in accordance with some embodiments. In the present embodiment the switching device 100 is a single pole double throw (SP2T) switch. Referring to FIG. 5, the equivalent circuit 500 comprises a first resistor 502, a first capacitor 504, a second capacitor 506, and a second resistor 508. Furthermore, the first resistor 502 is an equivalent circuit of the first switch cell 102, the first capacitor 504 is an equivalent circuit of the second switch cell 104, the second capacitor 506 is an equivalent circuit of the third switch cell 106, and the second resistor 508 is an equivalent circuit of the fourth switch cell 108. Specifically, the first resistor 502 and the second resistor 508 are modeled by equation (1) that governs the resistance R, and the first capacitor 504 and the second capacitor 506 are modeled by equation (2) that governs the capacitance C.

Then, when the equivalent circuit 500 is analyzed, it is obtained that the harmonics of the equivalent circuit 500 is dominated by the first resistor 502. More specifically, for a SP2T switch, the harmonics of the SP2T switch is dominated by the resistance of the signal path between the first port TRx1 and the antenna Ant. This means that, in comparison to the first capacitor 504, the second capacitor 506 and the second resistor 508 in the equivalent circuit 500, the first resistor 502 contributes the most harmonics to the equivalent circuit 500. Moreover, the second harmonic in the harmonics is dominated by the coefficients $V_{C1}$ in the equation (1), and the third harmonic in the harmonics is dominated by the coefficients $V_{C2}$ in the equation (1). It is noted that the second harmonic is a signal with double the fundamental frequency, and the third harmonic is a signal with triple the fundamental frequency. The fundamental frequency is the frequency of the desired RF signal.

In addition, the coefficients $V_{C2}$ in the equation (1) corresponding to the resistance R of a turn-on MOSFET is caused by a lateral electrical field in the channel region of the MOSFET. Specifically, when the MOSFET is turned on by a gate control signal, the channel inversion charge in the channel region is controlled by the gate control signal and the drain voltage of the MOSFET. The channel inversion charge in the channel region may determine the coefficients $V_{C2}$ in the equation (1) corresponding to the resistance R of the turn-on MOSFET. According to some embodiments, the resistance R is expressed by the following equation (3):

$$R=1/[uC_{ox}(W/L)(V_{gs}-V_{th}-V_{ds})] \qquad (3)$$

The parameter u is the electron mobility. The parameter $C_{ox}$ is the capacitance per unit gate area of the oxide layer. W is the channel width of the MOSFET. L is the channel length of the MOSFET. $V_{th}$ is the threshold voltage of the MOSFET. $V_{gs}$ is the voltage between the gate terminal and the source terminal of the MOSFET. $V_{ds}$ is the voltage between the drain terminal and the source terminal of the MOSFET.

Figure 6:
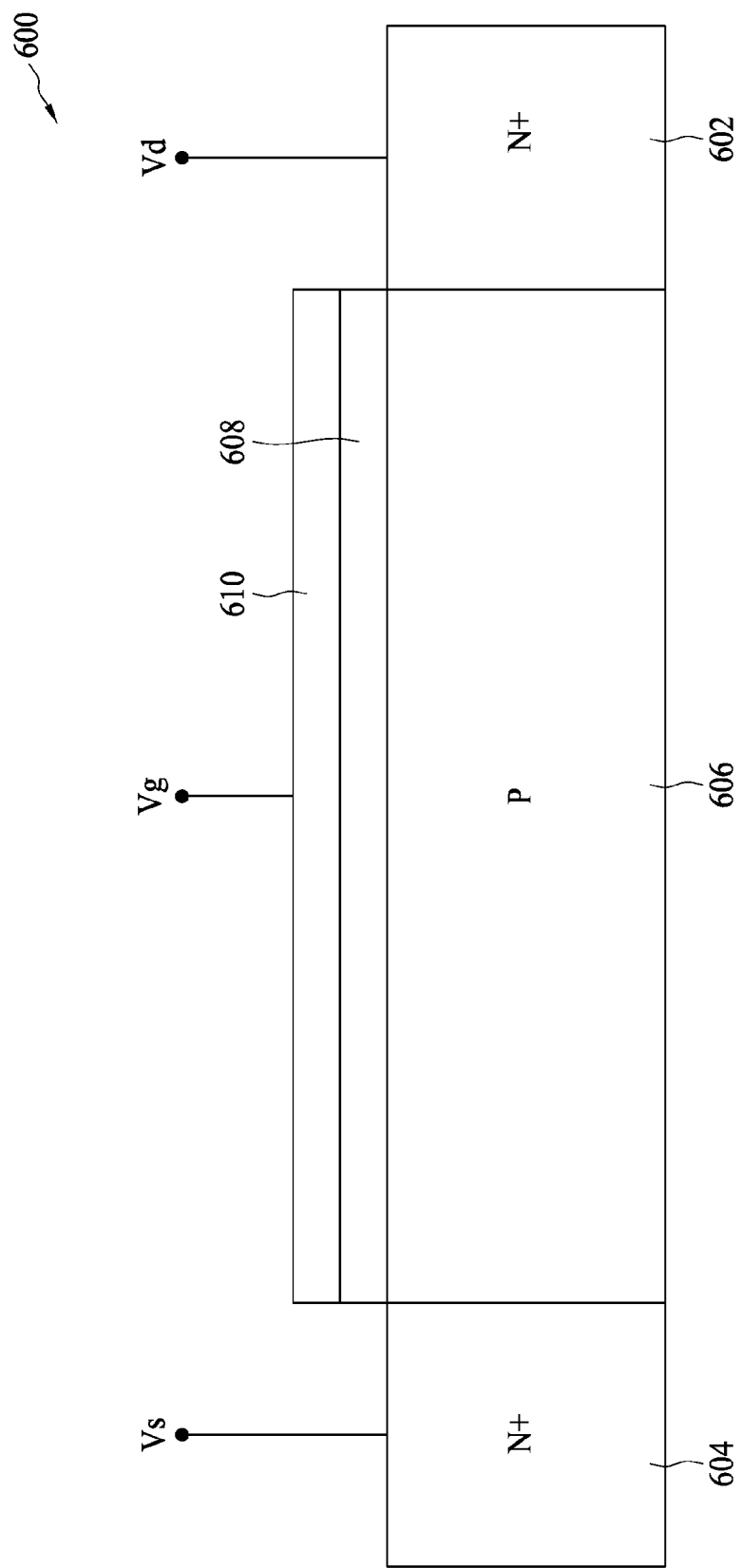
FIG. 6 is a diagram illustrating a cross-sectional view of a MOSFET in accordance with some embodiments.

FIG. 6 is a diagram illustrating a cross-sectional view of a MOSFET 600 in accordance with some embodiments. For illustrative purpose, the MOSFET 600 is an N-type MOSFET. The MOSFET 600 comprises a drain region 602, a source region 604, a channel region 606, a dielectric layer 608, and a gate layer 610. The drain region 602 is coupled to the drain voltage $V_d$. The source region 604 is coupled to the source voltage $V_s$. The gate layer 610 is coupled to the gate control voltage $V_g$. The drain region 602 and the source region 604 are heavily doped with the N-type dopant. The heavily doped N-type dopant is denoted by N+. The channel region 606 is lightly doped with the P-type dopant. The lightly doped P-type dopant is denoted by P. It is noted that the drain region 602, the source region 604, and the channel region 606 are disposed over a buried oxide (BOX) layer (not shown), and the buried oxide is disposed over a silicon substrate layer (not shown). When the entire channel region 606 is lightly doped with P-type dopant, approximately 99% of the channel inversion charge in the channel region 606 is controlled by the gate control signal $V_g$, and 1% of the channel inversion charge is controlled by the drain voltage $V_d$ when the MOSFET 600 is turned on by the gate control signal $V_g$. In other words, when the entire channel region 606 is lightly doped with P-type dopant, the resistance R of the turn-on MOSFET 600 is affected by the voltage (i.e. $V_{ds}$) between the drain terminal and the source terminal of the MOSFET 600 as expressed in the above-mentioned equation (3). Since the resistance R of the turn-on MOSFET 600 is affected by the voltage between the drain terminal and the source terminal, the nonlinear term "$V_{C2}V_{ds}^2$" in the equation (1) cannot be neglected. As a result, when a switching device is composed of the MOSFET 600, the switching device may induce a high power of the third harmonic.

Figure 7:
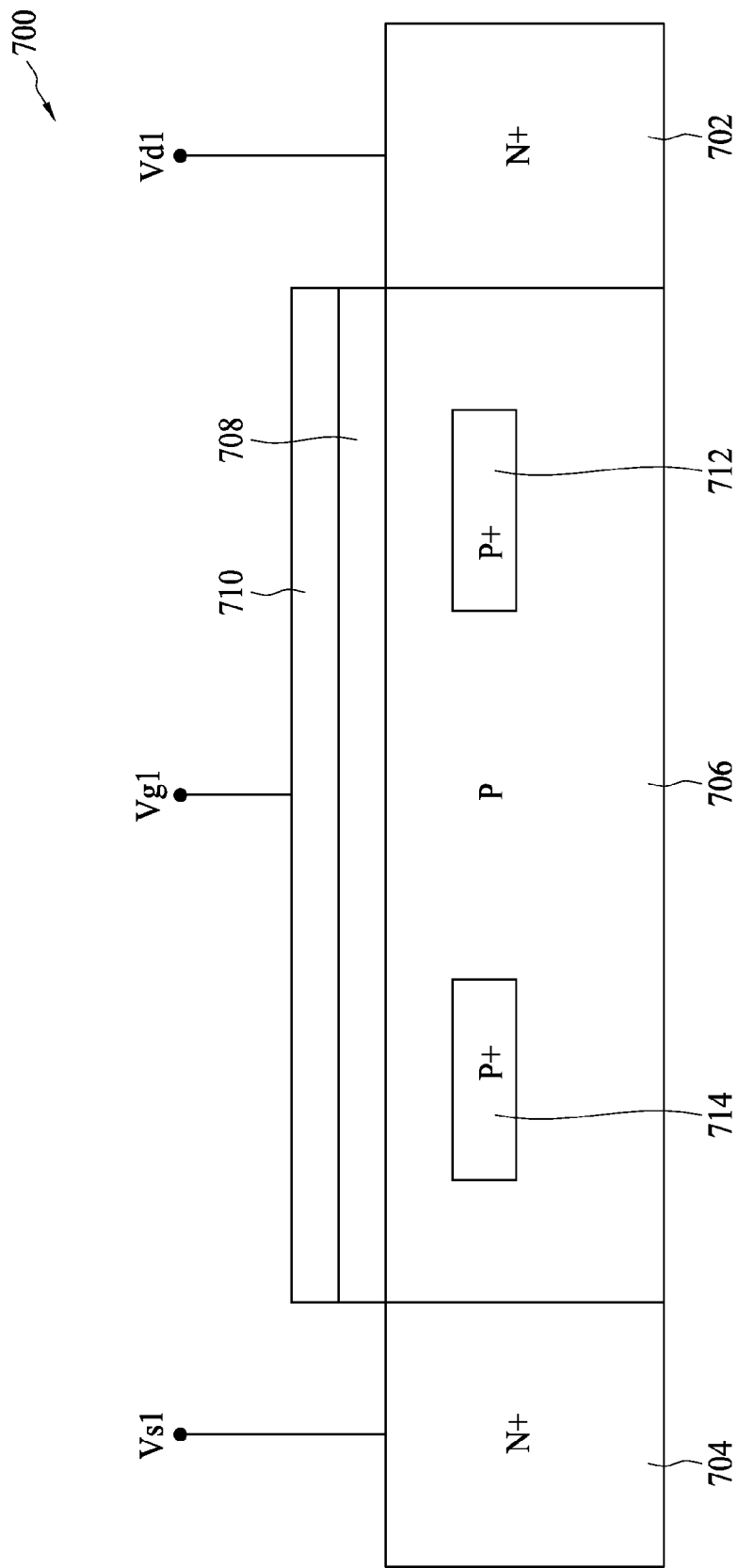
FIG. 7 is a diagram illustrating a cross-sectional view of a MOSFET in accordance with some embodiments.

According to some embodiments, to solve the problem of the switching device using the MOSFET 600, a first heavily doped P-type region and a second heavily doped P-type region are formed in the channel region 606. FIG. 7 is a diagram illustrating a cross-sectional view of a MOSFET 700 in accordance with some embodiments. For illustrative purpose, the MOSFET 700 is an N-type MOSFET. The MOSFET 700 comprises a drain region 702, a source region 704, a channel region 706, a dielectric layer 708, and a gate layer 710. The drain region 702 is coupled to the drain voltage $V_{d1}$. The source region 704 is coupled to the source voltage $V_{s1}$. The gate layer 710 is coupled to the gate control voltage $V_{g1}$. The drain region 702 and the source region 704 are heavily doped with the N-type dopant, i.e., N+. The channel region 706 is lightly doped with the P-type dopant, i.e., P. Moreover, a first region 712 heavily doped with P-type dopant and a second region 712 heavily doped with P-type dopant (i.e., P+) are formed in the channel region 706. The first region 712 and the second region 714 are near, but not overlapped with, the drain region 702 and the source region 704, respectively. The first region 712 and the second region 714 are also near, but not overlapped with, the dielectric layer 708. It is noted that the drain region 702, the source region 704, and the channel region 706 are disposed over a buried oxide (BOX) layer (not shown), and the buried oxide is disposed over a silicon substrate layer (not shown).

The first region 712 and the second region 714 are used to reduce the effect of inversing the charges on the channel region 706 caused by the drain voltage $V_{d1}$ and the source voltage $V_{s1}$. Accordingly, when the heavily doped first region 712 and the heavily doped second region 714 are formed in the channel region 706, the channel inversion charge in the channel region 706 may be fully controlled by the gate control signal $V_g$ when the MOSFET 700 is turned on by the gate control signal $V_g$, and the effect caused by the drain voltage $V_{d1}$ and the drain voltage $V_{s1}$ can be omitted. In other words, the resistance R of the turn-on MOSFET 700 may not be affected by the voltage (i.e. $V_{ds}$) between the drain terminal and the source terminal of the MOSFET 700. When the resistance R of the turn-on MOSFET 700 is not affected by the voltage between the drain terminal and the source terminal, the nonlinear term "$V_{C2}V_{ds}^2$" in the equation (1) can be omitted. As a result, when a switching device is composed of the MOSFET 700, the switching device may not induce a high power of the third harmonic, and the third harmonic may be omitted.

In addition, the harmonics of a single pole eight throw (SP8T) switch is dominated by the capacitance of the antenna Ant. The capacitance may be contributed by seven turned-off switch cells when one switch cell is turned on. For example, if the SP8T switch is arranged to route the RF signal from the antenna Ant to the first output path, then the first switch cell between the antenna Ant is turned on and the remaining seven switch cells are turned off. The seven turn-off switch cells may contribute a large capacitance to the antenna Ant.

In particular, referring to FIG. 6 again, for the capacitance C of a turned-off switch cell, the variation of the capacitance C is dominated by the voltage $V_{gs}$ between the gate terminal G and the source terminal S and the voltage $V_{gd}$ between the gate terminal G and the drain terminal D of the switch cell. The capacitance C is also affected by the voltage $V_{ds}$ between the drain terminal D and the source terminal S as shown in FIG. 8. FIG. 8 is a diagram illustrating the variation of the capacitance C corresponding to the voltage $V_{ds}$ between the drain terminal D and the source terminal S of the turned-off switch cell in accordance with some embodiments. Curve 802 represents the variation of the capacitance C corresponding to the voltage $V_{ds}$. The curve 802 is a nonlinear curve as expressed by the equation (2).

When the entire channel region 606 is lightly doped with the P-type dopant, the channel region 606 and the drain region 602 form a first PN diode, and the channel region 606 and the drain region 602 form a second PN diode. When the MOSFET 600 is turned off, the voltage between the drain region 602 and the channel region 606 is a positive voltage, and the voltage between the source region 604 and the channel region 606 is also a positive voltage. As a result, the first PN diode and the second PN diode may induce a first depletion region and a second depletion region, respectively. The capacitance of the depletion region of a PN diode is expressed in the following equation (4):

$$C_d = \in A/W_d \propto \in A/(V_{PN})^{1/2} \qquad (4)$$

$\in$ is dielectric constant. A is the contact area between the PN junction. $W_d$ is the depletion width of the PN junction. $V_{PN}$ is the voltage between the PN junction. Accordingly, $W_d$ is proportional to $(V_{PN})^{1/2}$ and is not proportional to $V_{PN}$. Since the depletion width $W_d$ is not proportional to voltage $V_{PN}$ between the PN junction, the voltage $V_{ds}$ may cause the capacitance C to have the nonlinear variation as shown in FIG. 8.

Figure 9:
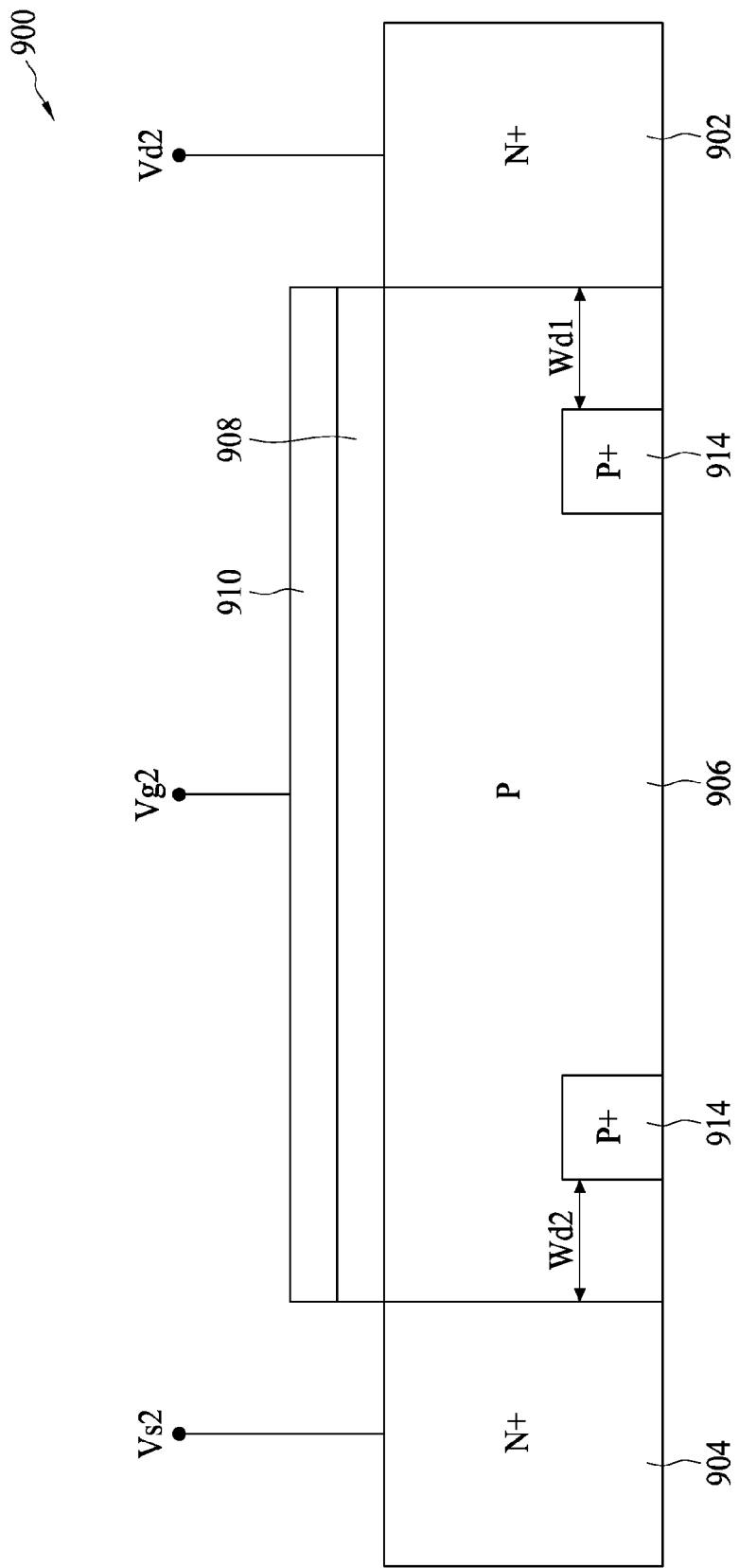
FIG. 9 is a diagram illustrating a cross-sectional view of a MOSFET in accordance with some embodiments.

According to some embodiments, to solve the problem of nonlinear capacitance of the switching device using the MOSFET 600, a first heavily doped P-type region and a second heavily doped P-type region are formed in the channel region 606. FIG. 9 is a diagram illustrating a cross-sectional view of a MOSFET 900 in accordance with some embodiments. For illustrative purpose, the MOSFET 900 is an N-type MOSFET. The MOSFET 900 comprises a drain region 902, a source region 904, a channel region 906, a dielectric layer 908, and a gate layer 910. The drain region 902 is coupled to the drain voltage $V_{d2}$. The source region 904 is coupled to the source voltage $V_{s2}$. The gate layer 910 is coupled to the gate control voltage $V_{g2}$. The drain region 902 and the source region 904 are heavily doped with the N-type dopant, i.e., N+. The channel region 906 is lightly doped with the P-type dopant, i.e., P. Moreover, a first region 912 heavily doped with P-type dopant and a second region 912 heavily doped with P-type dopant (i.e., P+) are formed in the channel region 906. The first region 912 and the second region 914 are near, but not overlapped with, the drain region 902 and the source region 904, respectively. The first region 912 and the second region 914 are also near, but not overlapped with, the dielectric layer 908. It is noted that the drain region 902, the source region 904, and the channel region 906 are disposed over a buried oxide (BOX) layer (not shown), and the buried oxide is disposed over a silicon substrate layer (not shown).

Figure 10:
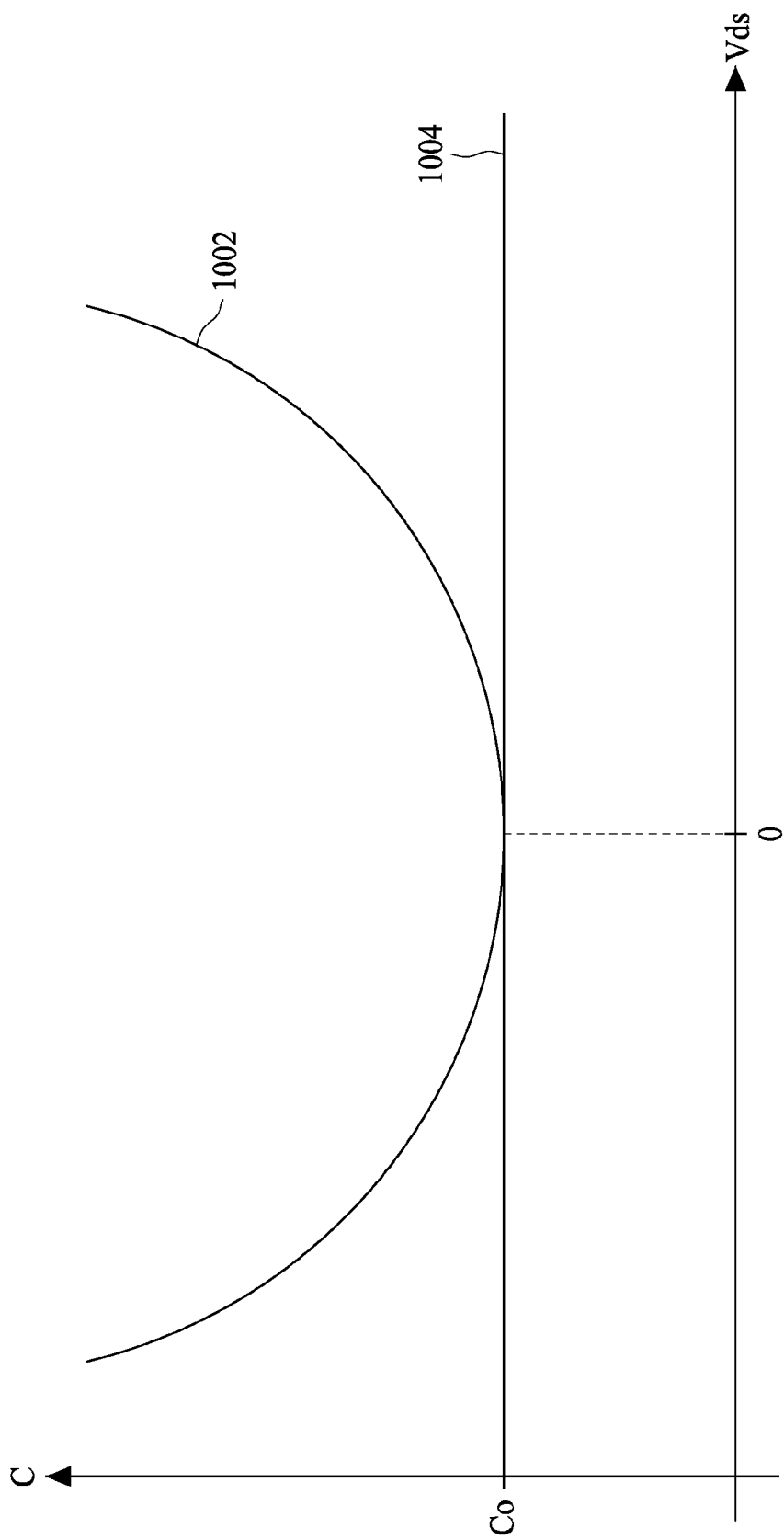
FIG. 10 is a diagram illustrating the variation of a capacitance corresponding to a voltage between a drain terminal and a source terminal of a turned-off switch cell in accordance with some embodiments.

The first region 912 is configured to make the depletion width $W_{d1}$ between the drain region 902 and the channel region 906 to be proportional to the voltage between the drain region 902 and the channel region 906. The second region 914 is configured to make the depletion width $W_{d2}$ between the source region 904 and the channel region 906 to be proportional to the voltage between the source region 904 and the channel region 906. Accordingly, when the heavily doped first region 912 and the heavily doped second region 914 are formed in the channel region 906, the depletion width in the channel region 706 is proportional to the voltage between the drain region 902 and the source region 904 when the MOSFET 900 is turned off. Then, the capacitance C of the turn-off MOSFET 900 may not be affected by the voltage (i.e., $V_{ds}$) between the drain terminal and the source terminal of the MOSFET 900 as shown in FIG. 10. FIG. 10 is a diagram illustrating the variation of the capacitance C corresponding to the voltage $V_{ds}$ between the drain terminal D and the source terminal S of the turned-off switch cell in accordance with some embodiments. Curve 1002 represents the variation of the capacitance C corresponding to the voltage $V_{ds}$ in the absence of the first region 912 and the second region 914. The curve 1002 is a nonlinear curve as expressed by the equation (2). Curve 1004 represents the variation of the capacitance C corresponding to the voltage $V_{ds}$ in the presence of the first region 912 and the second region 914. It can be seen that the capacitance C is relatively stable and is not affected by the voltage $V_{ds}$. Since the capacitance C of the turn-off MOSFET 900 is not affected by the voltage between the drain terminal and the source terminal, the nonlinear term "$V_{C2}V_{ds}^2$" in the equation (2) can be omitted. As a result, when a SP8T switch is composed of the MOSFET 900, the SP8T switch may not induce a high power of the harmonic, and the harmonic may be omitted.

When the semiconductor configuration of FIG. 7 is combined with the semiconductor configuration of FIG. 9, the semiconductor configuration of FIG. 3 is obtained. Moreover, the semiconductor configuration of FIG. 3 may possess both of the advantages of the semiconductor configurations of FIG. 7 and FIG. 9. Accordingly, when a switching device is composed of the transistor 300, the power of harmonic of the switching device is decreased.

Briefly, according to the present disclosure, when a first PIN diode is formed between the channel region and the drain region and/or a second PIN diode is formed between the channel region and the source region of a MOSFET, the turn-on resistance the MOSFET is not affected by the voltage between the drain terminal and the source terminal. Moreover, the turn-off capacitance the MOSFET is not affected by the voltage between the drain terminal and the source terminal the MOSFET. When the MOSFET is used to form a switching device, the power of harmonic of the switching device is significantly reduced.

In some embodiments, a semiconductor device is disclosed. The semiconductor device comprises a first doping region, a second doping region, and a channel region. The first doping region is doped with a first type of dopant. The second doping region is doped with the first type of dopant. The channel region is doped with a second type of dopant. The channel region is configured to have a first region with a first concentration of the second type of dopant and a second region with a second concentration of the second type of dopant, and the second concentration is higher than the first concentration.

In some embodiments, a semiconductor device is disclosed. The semiconductor device comprises a first doping region, a second doping region, and a channel region. The first doping region is doped with a first type of dopant. The second doping region is doped with the first type of dopant. The channel region is doped with a second type of dopant. The channel region and the first doping region are configured to form a first PIN (p-intrinsic-n) diode.

In some embodiments, a switching device is disclosed. The switching device comprises a first transistor. The first transistor is arranged to selectively couple a first connecting terminal to a second connecting terminal according to a first control signal, the first transistor comprises a first doping region, a second doping region, and a first channel region. The first doping region is doped with a first type of dopant and coupled to the first connecting terminal. The second doping region is doped with the first type of dopant and coupled to the second connecting terminal. The first channel region is doped with a second type of dopant and controlled by the first control signal. The first channel region is configured to have a first region with a first concentration of the second type of dopant and a second region with a second concentration of the second type of dopant, and the second concentration is higher than the first concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A switch device, comprising:
a first transistor, arranged to selectively couple a first connecting terminal to a second connecting terminal according to a first control signal, the first transistor comprising:
a first doping region, doped with a first type of dopant and coupled to the first connecting terminal;
a second doping region, doped with the first type of dopant and coupled to the second connecting terminal; and
a first channel region, doped with a second type of dopant and controlled by the first control signal, wherein the first channel region is configured to have a first region with a first concentration of the second type of dopant and a second region with a second concentration of the second type of dopant, and the second concentration is higher than the first concentration;
wherein the first channel region further comprises a third region with a third concentration of the second type of dopant, and the third concentration is higher than the first concentration, the second region is closer to the first doping region than the second doping region and is not overlapped with the first doping region, and the third region is closer to the second doping region than the first doping region and is not overlapped with the second doping region.

2. The switch device of claim 1, wherein the first type of dopant and the second type of dopant are N-type dopant and P-type dopant respectively, or the first type of dopant and the second type of dopant are P-type dopant and N-type dopant respectively.

3. The switch device of claim 1, wherein the first transistor further comprises: a dielectric layer, disposed over the channel region; wherein the second region does not overlap the dielectric layer.

4. The switch device of claim 3, wherein the first transistor further comprises:
a gate layer, disposed over the dielectric layer;
wherein the gate layer is coupled to the first control signal.

5. The switch device of claim 1, wherein the first transistor further comprises:

a dielectric layer, disposed over the first channel region;
wherein the second region and the third region do not overlap the dielectric layer.

6. A switch device, comprising:
a first transistor, arranged to selectively couple a first connecting terminal to a second connecting terminal according to a first control signal, the first transistor comprising:
   a first doping region, doped with a first type of dopant and coupled to the first connecting terminal;
   a second doping region, doped with the first type of dopant and coupled to the second connecting terminal; and
   a first channel region, doped with a second type of dopant and controlled by the first control signal, wherein the first channel region is configured to have a first region with a first concentration of the second type of dopant and a second region with a second concentration of the second type of dopant, and the second concentration is higher than the first concentration; and
a second transistor, arranged to selectively couple the second connecting terminal to a third connecting terminal according to a second control signal;
wherein when the first control signal controls the first transistor to couple the first connecting terminal to the second connecting terminal, the second control signal controls the second transistor to not couple the second connecting terminal to the third connecting terminal, and the second transistor comprises:
   a third doping region, doped with the first type of dopant and coupled to the second connecting terminal;
   a fourth doping region, doped with the first type of dopant and coupled to the third connecting terminal; and
   a second channel region, doped with the second type of dopant and controlled by the second control signal, wherein the second channel region is configured to have a fourth region with a fourth concentration of the second type of dopant and a fifth region with a fifth concentration of the second type of dopant, and the fifth concentration is higher than the fourth concentration.

7. The switch device of claim 6, wherein the second channel region further comprises a sixth region with a sixth concentration of the second type of dopant, and the sixth concentration is higher than the fourth concentration.

8. The switch device of claim 7, wherein the second channel region is between the fifth doping region and the sixth doping region, the fifth region is closer to the third doping region than the fourth doping region, and the sixth region is closer to the fourth doping region than the third doping region.

9. The switch device of claim 7, wherein the fifth region and the sixth region are near, but not overlapped with, the third doping region and the fourth doping region respectively.

10. The semiconductor device of claim 7, wherein the second transistor further comprises:

a dielectric layer, disposed over the second channel region;
wherein the fifth region and the sixth region do not overlap the dielectric layer.

11. The switch device of claim 6, wherein the fifth region is near, but not overlapped with, one of the third doping region and the fourth doping region.

12. The switch device of claim 11, wherein the second transistor further comprises:
   a dielectric layer, disposed over the second channel region;
   wherein the fifth region does not overlap the dielectric layer.

13. The switch device of claim 12, wherein the second transistor further comprises:
   a gate layer, disposed over the dielectric layer;
   wherein the gate layer is coupled to the second control signal.

14. The switch device of claim 6, further comprising:
a third transistor, arranged to selectively couple the first connecting terminal to a reference voltage according to the second control signal, wherein third transistor comprises:
   a fifth doping region, doped with the first type of dopant and coupled to the first connecting terminal;
   a sixth doping region, doped with the first type of dopant and coupled to the reference voltage; and
   a third channel region, doped with the second type of dopant and controlled by the second control signal, wherein the third channel region is configured to have a sixth region with a sixth concentration of the second type of dopant and a seventh region with a seventh concentration of the second type of dopant, and the seventh concentration is higher than the sixth concentration.

15. The switch device of claim 14, further comprising:
a fourth transistor, arranged to selectively couple the third connecting terminal to the reference voltage according to the first control signal, wherein fourth transistor comprises:
   a seventh doping region, doped with the first type of dopant and coupled to the third connecting terminal;
   an eighth doping region, doped with the first type of dopant and coupled to the reference voltage; and
   a fourth channel region, doped with the second type of dopant and controlled by the first control signal, wherein the fourth channel region is configured to have an eighth region with an eighth concentration of the second type of dopant and a ninth region with a ninth concentration of the second type of dopant, and the ninth concentration is higher than the eighth concentration.

16. The switch device of claim 15, wherein when the first control signal controls the fourth transistor to couple the third connecting terminal to the reference voltage, the second control signal controls the third transistor to not couple the first connecting terminal to the reference voltage.

* * * * *